United States Patent

Morishige et al.

[11] Patent Number: 5,724,132
[45] Date of Patent: Mar. 3, 1998

[54] EXTRANEOUS SUBSTANCE INSPECTION APPARATUS FOR PATTERNED WAFER

[75] Inventors: Yoshio Morishige, Honjo; Hisato Nakamura, Saitama-ken; Tetsuya Watanabe, Honjo, all of Japan

[73] Assignee: Hitachi Electronics Engineering Co., Ltd., Tokyo, Japan

[21] Appl. No.: 736,582

[22] Filed: Oct. 24, 1996

[30] Foreign Application Priority Data

Nov. 21, 1995 [JP] Japan ................................ 7-326310

[51] Int. Cl.$^6$ ............................................. G01N 21/00
[52] U.S. Cl. ...................... 356/237; 356/349; 356/430; 356/335
[58] Field of Search ........................... 356/237, 360, 356/371, 349, 388, 430, 429, 335

[56] References Cited

U.S. PATENT DOCUMENTS

| | | | |
|---|---|---|---|
| 5,343,290 | 8/1994 | Batcheldor et al. | 356/237 |
| 5,369,495 | 11/1994 | Lagowski | 356/237 |

FOREIGN PATENT DOCUMENTS

| | | |
|---|---|---|
| 7-243977 | 9/1995 | Japan. |
| 7-243978 | 9/1995 | Japan. |

*Primary Examiner*—Frank G. Font
*Assistant Examiner*—Reginald A. Ratliff
*Attorney, Agent, or Firm*—Fay, Sharpe, Beall, Fagan, Minnich & McKee

[57] ABSTRACT

An extraneous substance inspection apparatus includes a level conversion circuit for converting a level of an extraneous substance detection signal obtained from a position in a first chip into one of multi-valued levels. A judging circuit determines the existence or absence of an extraneous substance by comparing a signal indicative of one of the multi-valued levels with another signal indicative of a converted level obtained by converting a detection signal detected at a similar position in another chip adjacent to the first chip.

9 Claims, 4 Drawing Sheets

EXTRANEOUS SUBSTANCE INSPECTION APPARATUS FOR PATTERNED WAFER

FIELD OF INVENTION

The present invention relates to an extraneous substance inspection apparatus for a patterned wafer and, particularly, to a extraneous substance inspection apparatus of an X-Y scanning type which can detect extraneous substance or contaminants on a patterned wafer with improved preciseness.

BACKGROUND OF THE INVENTION

In a manufacturing process for integrated circuits (IC's), extraneous substance or contaminants on a surface of a wafer having various patterns of semiconductor regions, insulating regions, electrodes and wiring causes performance of resulting IC's to be degraded. In order to avoid such degradation of performance of the IC, contaminants of the wafer are detected in forming each of the various patterns by a wafer contaminant inspection apparatus.

There are two types of wafer contaminant inspection apparatus, one being X-Y scan type in which a surface of a wafer is scanned with laser beams in X and Y directions and the other being rotary scan type in which a surface of wafer is scanned spirally or concentrically with a laser beam while the wafer is rotated.

Figures 4A, 4B, 4C:
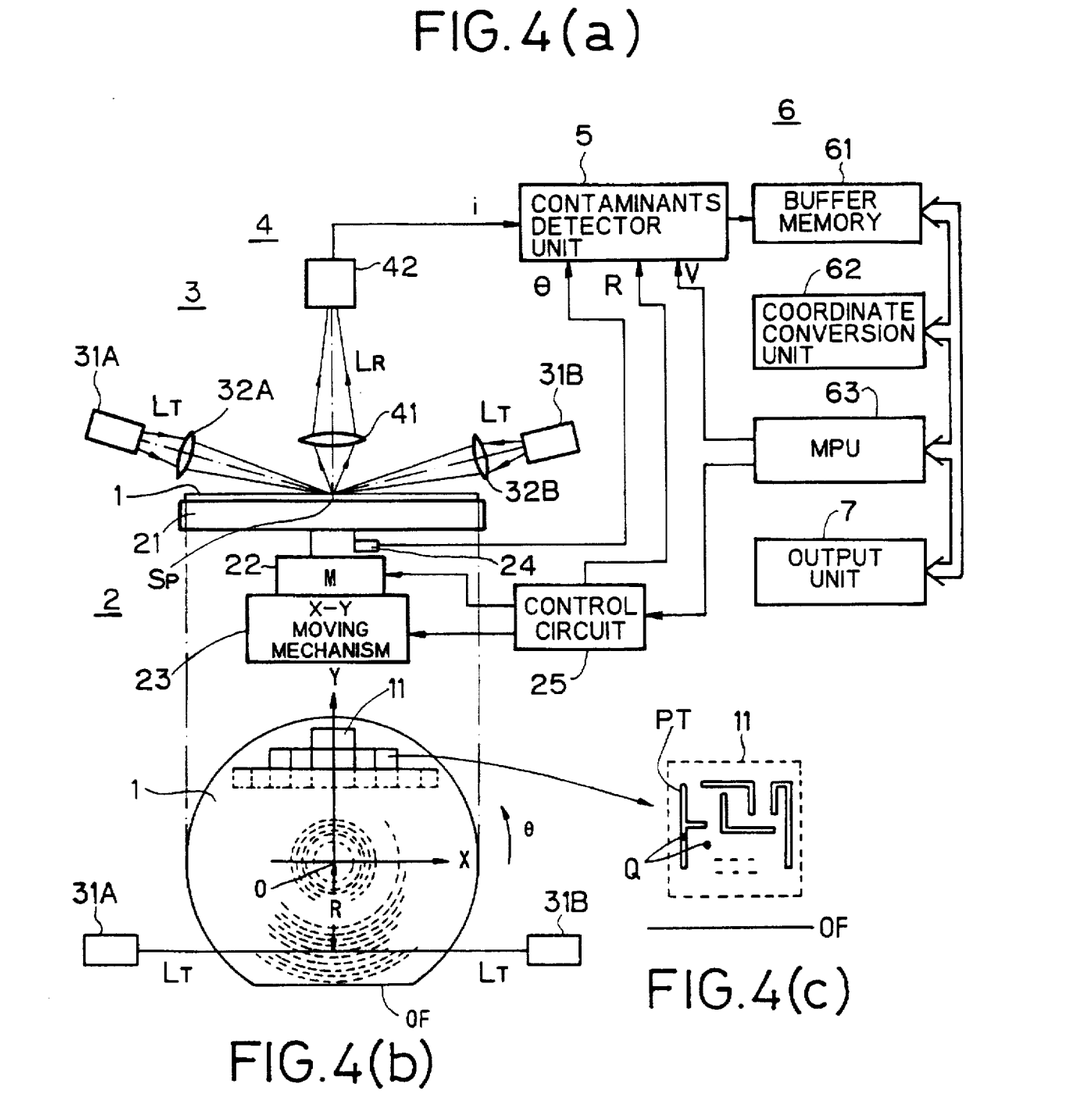
FIG. 4(a) shows a construction of an example of a contaminant inspection apparatus of rotary scan type.
FIG. 4(b) shows a relation between IC chips formed on a wafer and a scanning in the apparatus shown in FIG. 1.
FIG. 4(c) shows a relation between a pattern and contaminants on one of the IC chips shown in FIG. 4(b)

FIG. 4(a) shows an example of construction of the wafer contaminants inspection apparatus of the rotary scan type. In FIG. 4(a), a patterned wafer 1 including IC chips 11 each containing a number of patterns is fixed onto a table 21 of a rotary mechanism 2. A surface of the wafer 1 is irradiated with laser beams $L_T$ from oppositely arranged laser sources 31A and 31B of a projector unit 3 at small angles of depression in the X directions. The laser beams are focused as spots $S_P$ by condenser lenses 32A and 32B, respectively, to define a contaminant detection area on the wafer 1. The wafer 1 is rotated in a θ direction by a motor (M) 22 under a control of a control circuit 25 as shown in FIG. 4(b). The wafer 1 is further moved continuously or in step in the Y direction by an X-Y moving mechanism 23. As a result, the surface of the wafer 1 is scanned spirally or concentrically by the spots $S_P$.

By scanning with spots $S_P$, any contaminants adhering to the surface of the wafer 1 and/or to the patterns thereof produce scattering light $L_R$ which is collected by a collector lens 41 of a light receiving unit 4 and received by a light receiving portion 42 including, for example, CCD image sensors and amplifiers. The light receiving portion 42 outputs a luminance signal i indicating a luminance of the scattering light $L_R$ as a detection signal.

On the other hand, a rotary encoder 24 connected directly to the motor 22 of the rotary mechanism 2 generates an angle signal θ indicating an angle of rotation of the wafer 1 and a position signal R indicating a scanning position of the spots $S_P$ moved in the Y direction, respectively, under a control of a control circuit 25 and these signals are supplied to a contaminant detector unit 5 together with the luminance signal i, as shown in FIG. 4(b).

The contaminant detector unit 5 preliminarily has a suitable threshold value V given by a microprocessor (MPU) 63 of a data processor unit 6. The luminance signal i input to the contaminant detector unit 5 is compared with the threshold value V to detect contaminants. A detection signal (data) of contaminants together with data of the rotation angle θ of the wafer 1 and the scanning position signal R becomes a contaminant data which is transferred to and stored in a buffer memory 61 of the data processor unit 6 temporarily.

After the detection of contaminants over the whole surface of the wafer 1 is completed, coordinates of respective contaminant data stored in the buffer memory are converted from Rθ coordinates into X-Y coordinates by a coordinate conversion unit 62 and displayed as a map on an output unit 7 constructed with a CRT display, etc.

Figure 5:
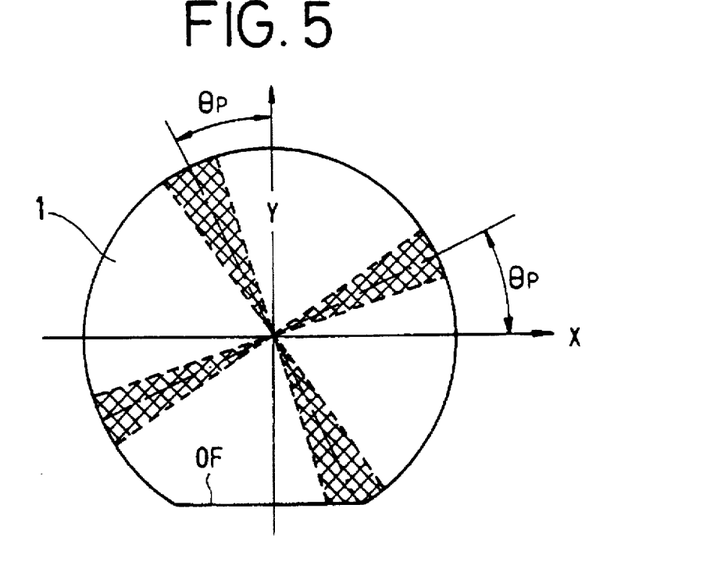
FIG. 5 illustrates a distribution of scattered light from a pattern on a wafer.

A pattern PT of wiring formed on the chip 11 is formed in a direction parallel to and/or perpendicular to an orientation flat (OF) of the wafer 1, as shown in FIG. 4(c). On the other hand, contaminants Q are randomly scattered on the pattern PT and other areas of the wafer surface which have no pattern. Scattered light $L_R$ from the pattern PT and the contaminants Q have features respectively. That is, the contaminants Q produce substantially omni-directional scattering light having magnitude corresponding to the size thereof. On the contrary, scattering light from an edge portion E of the pattern PT is rather stronger than that from an area portion of the pattern and has a directivity depending upon the direction of the pattern PT. This fact is shown in FIG. 5. In FIG. 5, the scattering light from the pattern PT is concentrated in hatched areas centered along lines making an angle $θ_P$ of about 22.5 degree with respect to X axis and Y axis.

Figure 6:
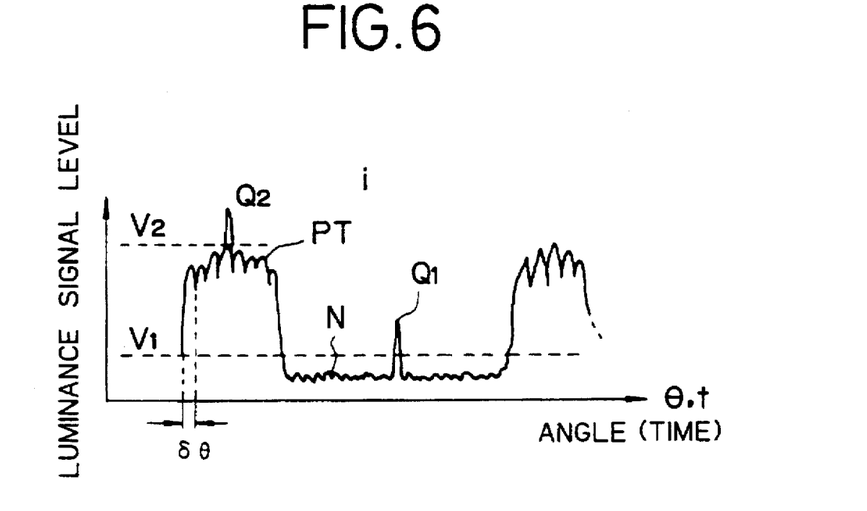
FIG. 6 shows an example of a detected waveform of a luminance signal and a detected waveform of contaminants.

FIG. 6 shows an example of a waveform of the luminance signal i in the above mentioned case. One of methods of detecting the contaminant Q will be described with reference to FIG. 6. The luminance signal i input to the contaminants detection unit 5 is sampled at every suitable angle δθ. In the specific area centered on the line making the angle of about 22.5 degrees with respect to the X or Y axis, an amplitude of the luminance signal i is substantial due to the scattering light from the pattern PT and a pulse $Q_2$ corresponding to the contaminant Q is overlapped thereon. On the other hand, in the other area of the wafer surface in which there is no pattern, the luminance signal i is noise level N on which a pulse of the contaminant $Q_1$ overlaps.

Although FIG. 6 shows the waveform of the luminance signal which includes only the high level portion corresponding to the pattern PT and the low level portion corresponding to the area having no pattern for simplicity of description, there may be waveforms having magnitudes intermediate between the high and low level portions.

If the data control unit 6 sets a fixed threshold value $V_1$ of the luminance signal i in the contaminant detection unit 5 which is slightly higher than the noise level N, the contaminant $Q_1$ can be detected easily. In such case, however, both the contaminant $Q_2$ and the pattern PT shall be detected as contaminants and erroneous information will result. In order to solve such problem, the data control unit 6 sets another fixed threshold value $V_2$ in the contaminants detection unit 5 which is slightly higher than the level of the pattern PT, instead of the threshold value $V_1$. In such case, the contaminant $Q_1$ cannot be detected. Therefore, the setting of the threshold value $V_1$ or $V_2$ is not adequate.

In order to totally solve the problems, a method of detecting contaminants by changing the threshold value dynamically correspondingly to a level of the luminance signal i has been proposed by the assignee of this application in Japanese Patent Application Laid-open No. Hei 7-243977 entitled "Calculation Method of Floating Threshold Value for Contaminant Detection" and in Japanese Patent Application Laid-open No. Hei 7-243978 entitled "Detection Apparatus of Contaminants on a Patterned Wafer".

Next, a construction of the contaminant inspection apparatus of the X-Y scan type will be described. The contaminants inspection apparatus of the X-Y scan type is constructed with substantially the same components as those shown in FIG. 4. Differences of the contaminant inspection apparatus of the X-Y scan type from that of the rotary scan type will be described. In the X-Y scan type apparatus, the motor 22 shown in FIG. 4 which is the rotary mechanism for the wafer 1 is used for merely positioning the wafer such that the orientation flat thereof becomes in parallel to the X or Y axis. The X-Y scan is performed by the X-Y moving mechanism 23. A laser beam $L_T$ from one of the laser light sources 31A and 31B of the projector unit 3 is usually used. Further, instead of the angle signal $\theta$ and the position signal R, X and Y coordinates are sent from the control circuit 25 or the MPU 63 to the contaminant detection unit 5. The coordinate conversion unit 62 is removed.

In the contaminant inspection apparatus of the X-Y scan type, the control circuit 25 drives the motor 22 to position the orientation flat of the wafer 1 and then performs the X-Y scan by driving the X-Y moving mechanism 23 to detect contaminants at respective scanning points.

It has been found by the present inventors that, in the contaminant inspection apparatus of either the rotary scan type or the X-Y scan type, a pattern is erroneously detected as contaminant when light receiving condition of a light receiving element is varied or optical detecting condition is varied or changed, even if the threshold value is dynamically changed as in Japanese Patent Application Laid-open Nos. Hei 7-243977 and Hei 7-243978.

Since the dynamic setting of threshold value mentioned above is performed by using a sample wafer of the same kind as that of the wafer to be inspected, the light receiving level of the sample wafer tends to become different from that of the wafer to be inspected due to difference in the inspecting condition. This fact may cause erroneous detection of contaminants to occur easily.

SUMMARY OF THE INVENTION

An object of the present invention is to provide a contaminant inspection apparatus capable of detecting contaminants on a patterned wafer with high precision.

In order to achieve the above object, the contaminant inspection apparatus for a patterned wafer according to the present invention, which detects contaminants on the patterned wafer having IC chips on the basis of a signal which is obtained by irradiating the pattered wafer with laser beam at a predetermined angle with respect to a surface of the patterned wafer and receiving scattering light reflected from the patterned wafer and which has a magnitude corresponding to a level of the received light, comprises a level conversion circuit for converting the level of a detection signal detected at a position in a certain one of the IC chips into one of multi-valued levels and a judging circuit responsive to a signal indicative of the one level for judging an existence or absence of contaminants by comparing the signal with another signal indicative of a converted level which is obtained by converting a detection signal detected at a similar position in another IC chip adjacent to the certain IC chip by the level conversion circuit.

In the present invention, a level of a detection signal, that is, luminance signal, obtained at a position on one IC chip is converted into one of a plurality of predetermined multi-valued levels and the one level is compared with a similarly converted level of a detection signal obtained at a similar position on another IC chip adjacent to the one IC chip. In this manner, the level of a reference value is not fixed and can be obtained from the adjacent IC chip. That is, in the present invention, the threshold value for contaminant detection is dynamically changed correspondingly to the light receiving condition and the inspecting condition. Further, since there are a plurality of conversion levels and the luminance signal obtained from the IC chip under inspection and the luminance signal obtained from the adjacent IC chip as the reference in comparison are varied similarly even if the conversion values are changed according to change of the light receiving condition and the inspecting condition, there is substantially no relative variation of the conversion values as the condition of comparison.

The level conversion to one of the multi-valued levels may be performed for the analog detection signal (referred to as "luminance signal", hereinafter) or for a digital value obtained by A/D conversion of the luminance signal. In the following description, the level conversion is performed for the digital signal.

When an object to be inspected is a pattern, there is a large scattering light produced and the level of the luminance signal becomes large correspondingly. Since, in this invention, the reference value for comparison is obtained from the adjacent IC chip, the position from which the luminance signal is obtained is different and there may be a case where only a small reference value for comparison can be obtained. In such case, a pattern from which a luminance signal having a high level compared with the level of a luminance signal on the reference side is obtained shall be detected as contaminant.

In order to avoid such situation, in an embodiment of the present invention, a first, pattern side level conversion circuit and a second, contamination side level conversion circuit are provided instead of a single level conversion circuit. A first level of a first luminance signal for detecting contaminants is obtained by converting a level of the first luminance signal obtained from a position in a certain one of IC chips, which is under inspection, by the first level conversion circuit and a second level of a second luminance signal is obtained by converting a level of the second luminance signal obtained from a position in another IC chip adjacent to the one IC chip, which corresponds to the position of the IC chip under inspection. The first level is compared with the second level. In this case, in order to avoid such erroneous detection of the pattern portion as contaminants, the first level conversion circuit performs a compression conversion such that a value of the converted level of the first luminance signal corresponding to a pattern portion of the one IC chip becomes smaller than a value of the converted level of the second luminance signal corresponding to a pattern portion of the adjacent IC chip. The compression conversion will be described in detail later on.

In the embodiment of the present invention, each of the first and second level conversion circuits converts a level of a signal into one of predetermined 8 (eight) steps. A width of each step of the first level conversion circuit is set as large as about 4 times a width of a corresponding step of the second level conversion circuit, so that the level conversion of the luminance signal in the first level conversion circuit is compressed to ¼.

When a single level conversion circuit is to be used, the single level conversion circuit converts levels of luminance signals obtained from corresponding positions of a detection side IC chip and a reference side IC chip into ones of predetermined steps, respectively, and the converted levels are compared with each other. In this case, the influence of variation of detecting condition is reduced compared with the conventional apparatus.

The number of levels set in the level conversion circuit is preferably 3 or more.

As mentioned previously, the first level conversion circuit is adapted to produce the level-converted reference level which is used as a comparison reference for detecting contaminant and is referred to as the pattern side level conversion circuit for the reason that patterns are formed on a major portion of the wafer surface and, in the X-Y scan system, a major portion of signals indicative of converted levels produced by this circuit are luminance signals obtained by the patterns. In this regard, the contaminant side level conversion circuit produces a signal indicative of a converted level of a luminance signal.

In the embodiment, the sensor for generating the luminance signal is composed of a row of a number of light receiving elements and a row of a corresponding number of CCD's arranged oppositely to the respective detecting elements. However, any optical sensor can be used instead of the row of CCD's so long as it can generate luminance signals correspondingly to a number of pixels as detection signals.

Although, in the following description, a contaminant detection apparatus of X-Y scan type will be described for simplicity of description, the comparing processing used in the contaminant inspection apparatus of X-Y scan type can be applied similarly to a contaminant inspection apparatus of rotary scan type.

DETAILED DESCRIPTION OF THE PREFERRED EMBODIMENTS

Figure 1:
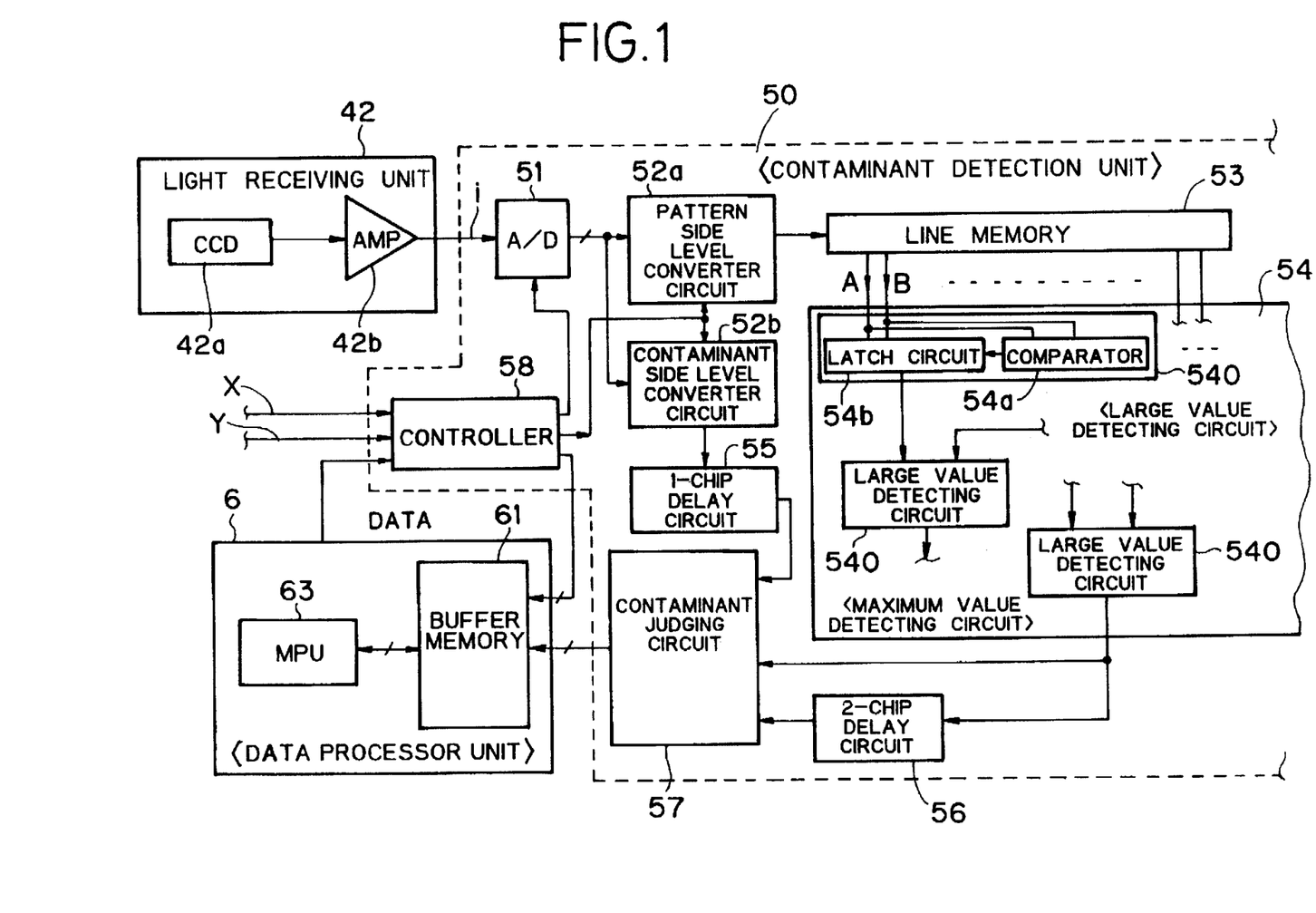
FIG. 1 is a block circuit diagram of a contaminant detecting unit of a contaminant inspection apparatus for patterned wafer, according to an embodiment of the present invention.

In FIG. 1, a contaminant detecting unit 50 corresponds to the contaminant detecting unit 4 shown in FIG. 4(a). The contaminant detecting unit 50 comprises an A/D converter circuit 51, a level converter circuit (referred to as "pattern side level converter circuit", hereinafter) 52a for obtaining a reference level for comparison by level-converting a luminance signal obtained from a pattern, a level conversion circuit (referred to as "contaminant side level converter circuit", hereinafter) 52b for level-converting a luminance signal obtained from contaminants, a line memory 53, a maximum value detector circuit 54, delay circuits 55 and 56, a contaminant judging circuit 57 and a controller 58.

Figure 2:
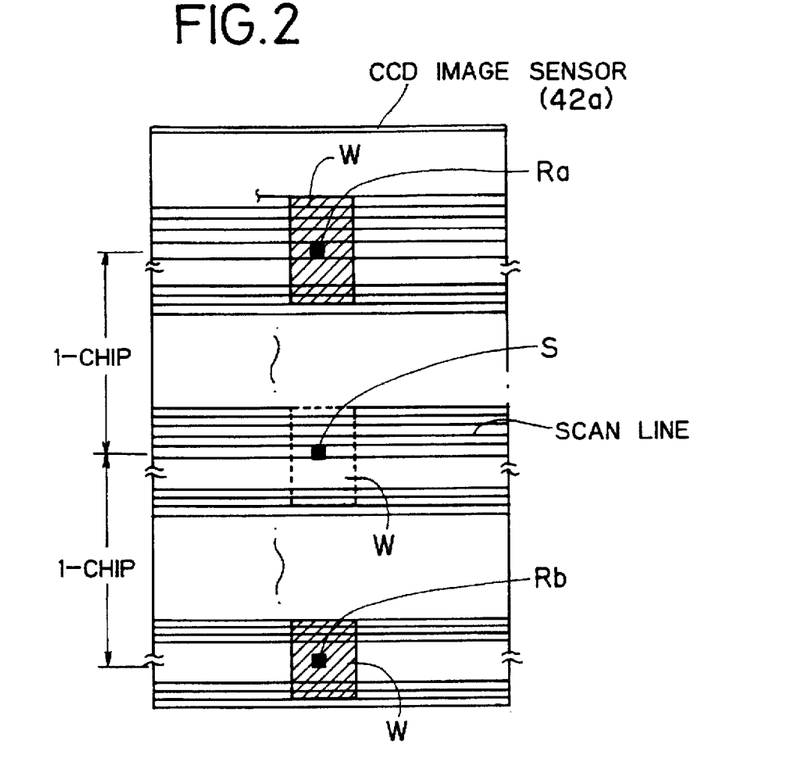
FIG. 2 is an illustration showing a detecting operation thereof.

In this embodiment, a laser beam $L_T$ from a light projector unit 3 is collimated to a line and defines a contaminant detection area on a wafer and an image of the line shaped contaminant detection area is focused on a line of CCD image sensors 42a of a light receiving unit 42 to detect contaminants by an X-Y scanning thereof, as shown in FIG. 2. In this embodiment, the line of CCD image sensors 42a is long enough to cover about 5000 pixels. The coordinates conversion unit 62 shown in FIG. 4 is removed since the apparatus is of X-Y scan type.

A U.S. patent application entitled "Extraneous Substance Inspection Method and Apparatus" and assigned to the assignee of this application was filed on Jul. 10, 1996, which discloses a technology for detecting contaminants in a line shaped contaminant detection area defined on a wafer by using CCD image sensors.

The A/D converter circuit 51 receives analog luminance signals i produced correspondingly to respective pixels from the light receiving unit 42 including the CCD image sensors 42a and amplifiers 42b, converts them into an 8-bit digital value of 256 tones and sends it to the pattern side level converter circuit 52a and the contaminant side level converter circuit 52b.

Each of the pattern side level converter circuit 52a and the contaminant side level converter circuit 52b converts a level of the data supplied from the A/D converter circuit 51 into one of 8 levels each of 3 bits to produce a 3-bit data indicative of a multi-valued level which corresponds to the level of the luminance signal. In this embodiment, the pattern side level converter circuit 52a differs from the contaminant side level converter circuit 52b in the range of each level for the luminance signal.

The line memory 53 receives multi-valued data of 8 tones each of 3 bits from the pattern side conversion circuit 52a, buffers the 3-bit data, each level of which is converted for respective pixels, for example, 55 pixels corresponding to an area covering 11×5 pixels, namely, the area W having 11 rows and 5 columns as shown in FIG. 2, and sends the 3-bit data corresponding to 55 pixels in parallel to the maximum value detecting circuit 54.

The line memory 53 includes shift registers arranged in a matrix of 3 rows×55 columns which receive 3-bit data on 55 pixels in the area W at a predetermined timing. Outputs of the 3 rows each including 55 shift registers are sent to the maximum value detecting circuit 54. The shift registers of each row receive, bit by bit, in parallel, 3-bit data which are level-converted by the pattern side level conversion circuit 52a and are shifted by 1-bit every reception of the 3-bit data. Therefore, the oldest level converted data is removed from the shift registers so that a newest data corresponding to a predetermined amount of pixels, in this example, 55 pixels in the area W, is always stored and sent to the maximum value detecting circuit 54.

Alternatively, the line memory 53 may be constructed with a FIFO memory capable of storing data corresponding to 55 pixels in the area W. In such case, an output data of the pattern side level conversion circuit 52a is stored in the FIFO memory sequentially at a predetermined timing and the data stored in the FIFO memory is sent to a register having capacity corresponding to 55 pixels each of 3 bits and provided in the maximum value detecting circuit 54.

The maximum value detecting circuit 54 includes a number of large value detecting circuits 540 for detecting large values and is adapted to determine a data having the maximum value from the multi-valued data corresponding to 55 pixels and send it to the delay circuit 55 and the contaminant judging circuit 57.

Each of the large value detecting circuits 540 comprises a comparator 54a for digitally comparing level-converted 3-bit data of a pixel A with level-converted 3-bit data of a pixels B and a latch circuit 54b for latching one of the level-converted data of the pixels A and B which is larger than the other. The large value detecting circuits 540 are cascade-connected hierarchically to detect the maximum value of the levels of 55 pixels each of 3 bits. That is, large values are detected in a certain hierarchy. The detected large values are compared in a next higher hierarchy to detect a larger value and, in a last state, the maximum value of level is obtained in the latch circuit 54b of the last large value detecting circuit 540.

The 1-chip delay circuit 55 receives a 3-bit data indicative of one of 8 tones from the contaminant side conversion circuit 52b. Using a pixel Ra at a center of an area W of 11×5 pixels of the maximum value detecting circuit 54 as a reference (cf. FIG. 2), the 3-bit data received by the 1-chip delay circuit 55 becomes a level-converted value of a luminance signal of a detection pixel S which is separated from the pixel Ra by pixels corresponding to 1 chip. The 1-chip delay circuit 55 produces a 3-bit data delayed from the pixel Ra by 1 chip, by producing a data delayed by a time corresponding to 1 chip (predetermined time) corresponding to a sampling time necessary to sample, for example, 5000×5 pixels, as shown by the detection pixel S at a center of the area in FIG. 2. This becomes a data of multi-valued level of the detection pixel S. The contaminant judging circuit 57 receives a data of the detection pixel S whose level is converted into the multi-valued level.

As mentioned, the maximum value in the area W including 11×5 pixels is detected for the reason described below. That is, in theory, it is enough to compare a converted level of a luminance signal of a detection pixel of one chip to be inspected with that of a pixel of an adjacent chip which is in a position corresponding to that of the detection pixel of the one chip. However, the positioning of an optical detection system is not so precise practically. Therefore, the area W is set while a positioning error on the reference side with respect to the contaminant side is taken into consideration and the converted level of the corresponding position is obtained by detecting the maximum value within the area W. Therefore, the size of the area W is not limited to 11×5 pixels and should be determined according to the accuracy of the detecting position, etc., of the optical detection system of the inspection apparatus.

The 2-chip delay circuit 56 differs from the 1-chip delay circuit 55 in that the delay time corresponds to 2 chips. The 2-chip delay circuit 56 delays the 3-bit data output from the maximum value detection circuit 54 by a time corresponding to 2 chips and sends the delayed 3-bit data to the contaminant judging circuit 57. This circuit is adapted to output a level conversion value of a luminance signal of a pixel which has a maximum value of a data of an area W containing a pixel Rb which is a reference pixel delayed from the area W containing the pixel Ra by a time correspinding to 2 chips, as shown in FIG. 2. For simplicity of description, it is assumed here that the pixel Rb at a center position of the area has the maximum value, correspondingly to the pixel Ra. The positions of the pixels Ra and Rb correspond to those shifted from the position of the detection pixel S by one chip in opposite directions, respectively.

The contaminant judging circuit 57 receives, from the maximum value detection circuit 54, a level conversion data of a pixel having the maximum value in the area W of 11×5 pixels, which is the 3-bit data of the reference pixel Ra, as mentioned previously.

The contaminant judging circuit 57 is constructed with a digital comparator. Assuming that the pixel S is to be inspected, the comparator receives level converted 3-bit data of the reference pixel Ra 1 chip after the pixel S and the reference pixel Rb 1 chip before the pixel S.

The contaminant judging circuit 57 compares the converted level value of the luminance signal of the reference pixel Ra with that of the reference signal Rb to select one of them which is larger. Then, the contaminant judging circuit compares the converted level value of the selected reference pixel with the level converted 3-bit data of the detection pixel S separated from the selected reference pixel by a distance corresponding to 1 chip and, when the data value of the detection pixel S is larger than the comparison data value, produces a detection signal indicative of the existence of contaminant. The contaminant judging circuit 57 produces a contaminant data from the detection and a detection position data composed of X coordinates and Y coordinates (in the case of rotary scan type, the angle signal θ and the position signal R indicative of the scanning position) and sends the data to the buffer memory 61. At this time, the contaminant judging circuit 57 updates the address of the buffer memory 61 every time the contaminant data is sent and stores the contaminant data in the updated address of the buffer memory 61 sequentially.

The X and Y coordinates mentioned above are sent from the control circuit 25 or the MPU 63 to the contaminant detection unit 50. Incidentally, in the rotary scan type, the angle signal θ and the position signal R are sent from the control circuit 25 to the contaminant detection unit 50.

The pattern side converter circuit 52a and the contaminant side converter circuit 52b are constructed with RAM's, respectively, which receive the A/D conversion data from the A/D converter 51 and are accessed with the digital value of the detected luminance signal as the address, the data read out from the accessed address being the level-converted value. In this manner, a level-converted data of one of 8 tones each of 3 bits, corresponding to the level of the luminance signal is obtained.

By this conversion, the value of each of the respective luminance signals on the contaminant side is made one of 8 tones S0-S7 and the value of each of the respective luminance signals on the pattern side is made one of 8 tones P0-P7. In the multi-valued level conversion of the luminance signal, the widths of the respective conversion stages of the contaminant side conversion circuit 52b are larger than the widths of the respective conversion stages of the pattern side conversion circuit 52a, so that the luminance signal on the contaminant side, that is, the detection signal, is compressed and level-converted.

Figure 3:
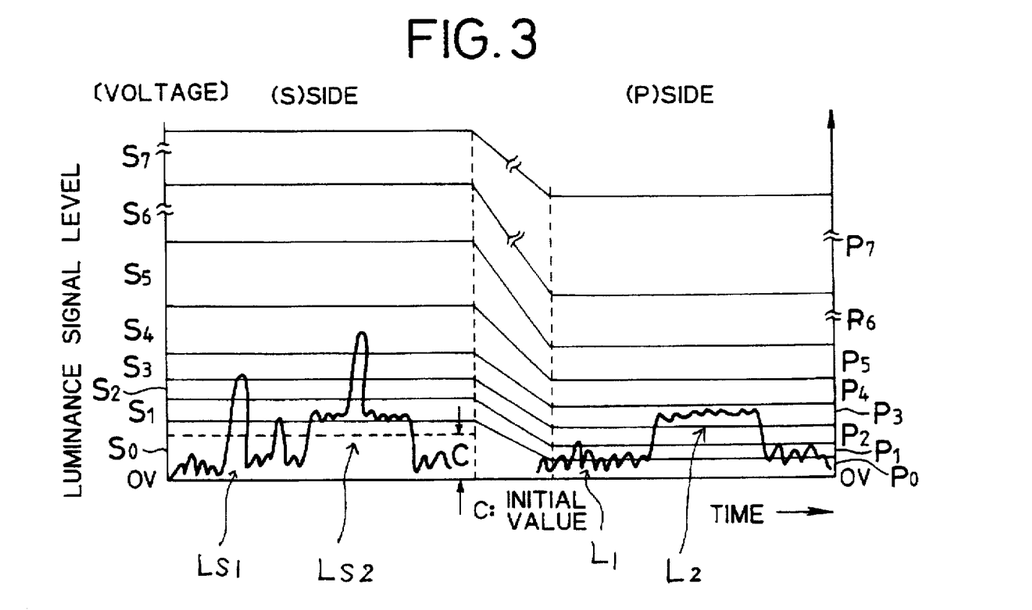
FIG. 3 is a graph explaining a multi-valued level conversion.

The controller 58 has the data stored in the RAM's as a data conversion table. The controller 58 references this table and stores the values of the respective luminance signals as the address values of the RAM's, for example, it stores the converted levels "0" to "7" each of 3-bit data as P0 to P7, as shown in FIG. 3. That is, under the control of the controller 58, the RAM of the pattern side conversion circuit 52a stores "0" in its addresses 0 and 1 as P0, "1" in its addresses 2 and 3 as P1, "2" in its addresses 4 and 5 as P2, "3" in its addresses 6 and 7 as P3, "4" in its addresses 8 to 15 as P4, "5" in its addresses 16 to 23 as P5, "6" in its addresses 24 to 39 as P6 and "7" in its addresses 40 to 64 as P7.

Similarly, under the control of the controller 58, the RAM of the contaminant side conversion circuit 52b stores "0" in its addresses 0 to 7 as S0, "1" in its addresses 8 to 15 as S1, "2" in its addresses 16 to 23 as S2, "3" in its addresses 24 to 31 as S3, "4" in its addresses 32 to 63 as S4, "5" in its addresses 64 to 95 as S5, "6" in its addresses 96 to 159 as S6 and "7" in its addresses 160 to 255 as S7. It is preferable to add an initial value C to the lowest level in the level conversion on the contaminant side as an offset. In the latter case, the last address in the level range of each luminance signal is shifted by adding the value C thereto.

The multi-valued level conversion having steps durations of which are different will be described with reference to FIG. 3.

As mentioned previously, when light receiving condition of a light receiving element is varied or optical detecting condition is varied or changed, the detection level of the same pattern is varied and detection error is produced. However, since adjacent chips of the same wafer are influenced similarly by the light receiving condition and the detecting condition, the influence of the variation of the light receiving condition and/or detecting condition can be restricted relatively by comparing a level of luminance signal from one of these chips with that of another chip as a reference. Further, by converting the luminance signal level into a plurality steps, there is substantially no relative variation of the conversion values as the reference of comparison since the luminance signal from the chip on the contaminant detection side and the luminance signal from the adjacent chip as the reference of comparison are varied similarly.

Since, according to this fact, a pattern area of one chip is compared with a pattern area of the other chip and an area of the one chip which includes no pattern is compared with an area of the other chip which includes no pattern, it becomes unnecessary to distinguish the pattern area from the non-pattern area. However, even in such case, the luminance signal level on the reference side is lowered when the same positions on mutually adjacent chips are compared. On the other hand, when the luminance signal level of the pattern portion on the detection side becomes larger, there may be a case where the luminance signal level on the detection side exceeds the luminance signal level of the reference side. In such case, there is an erroneous detection of contaminant.

According to experiments conducted on a number of wafers, it has been found that a peak level of a luminance signal from contaminant on a pattern area or a non-pattern area is higher than about four times, in average, that from a pattern area or a non-pattern area which has no contaminant. The peak level value may be lowered when a detection level of a luminance signal is low or increased when the accuracy of the optical detection system is improved.

By detecting contaminant using a luminance signal having detection level as high as four times that of the other as a reference according to the experiments, contaminant can be detected even by compressing the luminance signal on the contaminant detection side to one fourth and by comparing it with the luminance signal on the reference side.

That is, since the luminance signal level from contaminant on a pattern is higher than four times in average that from a pattern having no contaminant, even if the luminance signal level is compressed one fourth and converted by the contaminant detection side level conversion circuit 52b, the converted level exceeds the level of the luminance signal from the adjacent chip, which is converted by the pattern side level conversion circuit 52a. Therefore, the detection of contaminant using the high level luminance signal as the reference is possible.

By compressing the detection side luminance signal in this manner, it is possible to lower the converted level of the luminance signal from the pattern portion on the detection side, on which there is no contaminant. Excluding the pixels whose luminance level from the patterned portion is high, it is possible to restrict the converted level value of the patterned portion of the detection side below this level even when the converted level of the pattern on the side of the reference is low. Therefore, it is possible to restricted the erroneous detection of the contaminant.

For this reason, the detection level of the luminance signal is compressed to ¼, in this embodiment. In order to do so, the width of level conversion on the contaminant detection side is made 4 times. FIG. 3 shows the multi-valued level conversion of this kind. A luminance signal L1 is that obtained from an area having no pattern. A luminance signal L2 is that obtained from a pattern area and luminance signals LS1 and LS2 are those obtained from a non-pattern area containing contaminant and a pattern area containing contaminant, respectively.

In FIG. 3, one fourth of, for example, 256 tones each of 8 bits, that is, 64 tones, are assigned to a range of level of the luminance signal on the pattern (P) side having no contaminant and the range is divided to 8 steps, that is, P7=40 to 64, P6=24 to less than 40, P5=16 to less than 24, P4=8 to less than 16, P3=6 to less than 8, P2=4 to less than 6, P1=2 to less than 4 and P0=0 to less than 2.

On the other hand, the 8-level conversion on the contaminant (S) side is performed according to $S7 \sim S0 = n \times P7 \sim P0$ where n=4, that is, S7=4×P7=160 to 255, S6=4×P6=96×160, S5=60 to less than 96, S4=38 to less than 16, S3=24 to less than 32, S2=16 to less than 24, S1=8 to less than 16 and S0=0 to less than 8.

The respective data stored in the RAM'S for level conversion correspond to the values mentioned above.

When the contaminant (S) side conversion levels are obtained from the pattern (P) side conversion level, the compression rate n is not limited to 4 and the compression rate may be any so long as, in the S side level conversion, the luminance signal level is reduced to an extent that a pattern is not erroneously detected as contaminant. Particularly, when contaminant is to be detected from a low level luminance signal, n may be set to a value larger than 1 and equal to or smaller than 4.

In general, the width of each step of the multi-valued level conversion of the luminance signal performed by the contaminant side level conversion circuit 52b is m times that of the multi-valued conversion performed by the pattern side level conversion circuit 52a where n is a ratio of a mean value of luminance signal containing contaminant information to a mean value of luminance signal containing no contaminant information and satisfies a relation 1<m<n.

Data for compressing the luminance level may be obtained according to experiments. When the width of the level conversion step is to be obtained as experimental value, an equation $S=P+k+C$ is employed where k is increased with stepping up of the level. It may be possible to set P0 in a range 0~ less than k+C and shift the range of each step by adding the initial value C thereto.

The data obtained by using such equation is stored in the data conversion table of the controller 58. The data in the table is set in an internal memory of the controller 58 as data under the control of the micro processor (MPU) 63 of the data processing unit 6. Thus, it becomes possible to arbitrarily set the data value externally under the control of the micro processor 63.

The luminance signal is multi-valued through the 8 steps shown in FIG. 3 and its value is converted into one of 8 tones and compared by the contaminant judging circuit 57.

Although the reference of comparison is the maximum value in a given area, it may be the data of the pixels Ra and Rb whose positions correspond to the position of the detection pixel.

In the described embodiment, the luminance signal from a test region on a test chip and the luminance signals from regions of chips adjacent to the test chip are obtained by delaying one and the same luminance signal. In this case, the 1-chip delay circuit 55 may be connected between the A/D converter 51 and the contaminant side level conversion circuit 52a so that the contaminant side level conversion circuit 52b and the pattern side level conversion circuit 52a receive the luminance signal from the contaminant inspection region and the luminance signal from the adjacent chip, respectively. Alternatively, it may be possible to provide the 1-chip delay circuit 55 on the output side of the maximum value detection circuit 54 so that it is connected in parallel to the 2-chip delay circuit 56.

What is claimed is:

1. An extraneous substance inspection apparatus for a patterned wafer, which detects extraneous substance on a patterned wafer having patterns in the form of IC chips on a basis of a detection signal which is obtained by irradiating said patterned wafer with a laser beam at a predetermined angle with respect to a surface of said patterned wafer and receiving scattering light reflected from said patterned wafer, the detection signal having a magnitude corresponding to a level of the received scattering light, the apparatus comprising level conversion means for converting the level of the detection signal obtained from a position in a certain chip of said wafer into one of multi-valued levels and a judging circuit for comparing a signal indicative of the one of multi-valued levels with another signal indicative of a converted level obtained by converting a detection signal detected at a similar position in another chip adjacent to said certain chip by said level conversion means to judge an existence or absence of an extraneous substance.

2. An extraneous substance inspection apparatus as claimed in claim 1, wherein the similar position of said adjacent chip is within a predetermined region and the another signal has a maximum value selected from said predetermined region.

3. An extraneous substance inspection apparatus as claimed in claim 2, wherein said multi-valued levels are three or more, said level conversion means includes a first and second level conversion circuits having inputs supplied with the detection signal, widths of the respective steps of the multi-valued conversion of said first level conversion circuit for the detecting signal are larger than widths of the respective steps of the multi-valued conversion of said second level conversion circuit, respectively, an output of said first level conversion circuit is assigned to the signal indicative of the one of multi-valued levels and an output of said second level conversion circuit is assigned to the another signal indicative of a converted level obtained by converting the detection signal detected at the similar position in said another chip.

4. An extraneous substance inspection apparatus as claimed in claim 3, further comprising a CCD optical sensor including detecting elements arranged in lines correspondingly to a number of pixels and an A/D converter circuit for converting analog detection signals from said detecting elements of said CCD optical sensor into a digital signal, wherein the detection signal is an output of said A/D converter circuit.

5. An extraneous substance inspection apparatus as claimed in claim 3, wherein said first level conversion circuit receives the detection signal of said certain chip and said second level conversion circuit receives the detection signal of said adjacent chip, wherein said certain chip and said adjacent chip are scanned by said laser beam in X and Y directions.

6. An extraneous substance inspection apparatus as claimed in claim 3, further comprising a 1-chip delay circuit for delaying a signal by a time corresponding to a distance of 1 chip, wherein said first and second level conversion circuits receive the detection signal of said certain chip and one of an output of the first level conversion circuit and an output of the second conversion circuit is delayed by said 1-chip delay circuit.

7. An extraneous substance inspection apparatus as claimed in claim 3, further comprising a maximum value detection circuit adapted to receive a predetermined number of data and output a data among them which has the maximum value, wherein the output of said second level conversion circuit is sent to said maximum value detection circuit, the output of said maximum value detection circuit being the another signal indicative of the converted level obtained by converting the detection signal detected at the similar position in said another chip.

8. An extraneous substance inspection apparatus as claimed in claim 3, wherein the width of each step of the multi-valued level conversion of said first level conversion circuit m times that of the multi-valued conversion of said second level conversion circuit where m satisfies a relation 1<m<n, where n is a ratio of a mean value of luminance signal containing contaminant information to a mean value of luminance signal containing no contaminant information.

9. An extraneous substance inspection apparatus as claimed in claim 2, further comprising an optical sensor including detecting elements arranged in lines correspondingly to a plurality of pixels and adapted to receive the scattering light from said respective pixels and output the detection signal, a buffer memory, a maximum value detection circuit and a delay circuit, wherein the detection signal is a digitized first data, said first level conversion circuit level-converts the first data to obtain a second data, said second level conversion circuit level-converts the first data to obtain a third data, said buffer memory responds to the second data to store a predetermined amount of data by removing an oldest data, said maximum value detection circuit detects one of data stored in said buffer memory which has the maximum value and outputs it as a fourth data, said delay circuit delays one of the fourth data and the third data by a scanning time corresponding to 1 chip, said judging circuit compares the one data delayed by said delay circuit with the other data not delayed by said delay circuit and judges an existence of extraneous substance when a value of the third data exceeds a value of the fourth data.

* * * * *